(12) United States Patent
Suzuki et al.

(10) Patent No.: US 10,801,903 B2
(45) Date of Patent: Oct. 13, 2020

(54) PRESSURE SENSOR HAVING A PLURALITY OF SHEET-LIKE AND LAMINATED PIEZOELECTRIC ELEMENTS

(71) Applicant: Yamaha Corporation, Hamamatsu-shi, Shizuoka (JP)

(72) Inventors: Yukitoshi Suzuki, Hamamatsu (JP); Mineko Kosugi, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 199 days.

(21) Appl. No.: 16/011,696

(22) Filed: Jun. 19, 2018

(65) Prior Publication Data

US 2018/0364113 A1  Dec. 20, 2018

(30) Foreign Application Priority Data

Jun. 20, 2017 (JP) ................. 2017-120810

(51) Int. Cl.
| | |
|---|---|
| G01L 1/16 | (2006.01) |
| H01L 41/053 | (2006.01) |
| H01L 41/083 | (2006.01) |
| H01L 41/193 | (2006.01) |
| G01L 9/00 | (2006.01) |
| H01L 41/113 | (2006.01) |
| H01L 41/047 | (2006.01) |

(52) U.S. Cl.
CPC ............... *G01L 1/16* (2013.01); *G01L 9/008* (2013.01); *H01L 41/0472* (2013.01); *H01L 41/053* (2013.01); *H01L 41/083* (2013.01); *H01L 41/1132* (2013.01); *H01L 41/193* (2013.01)

(58) Field of Classification Search
None
See application file for complete search history.

(56) References Cited

U.S. PATENT DOCUMENTS

| | | | |
|---|---|---|---|
| 7,376,239 B2 | 5/2008 | Kirjavainen | |
| 7,573,181 B2* | 8/2009 | Rhim | H01L 41/27 310/328 |
| 8,076,825 B1* | 12/2011 | Kaajakari | H02N 2/181 290/1 R |
| 8,471,442 B2* | 6/2013 | Hatano | C04B 35/495 252/62.9 PZ |
| 9,635,467 B2* | 4/2017 | Miyoshi | H04R 17/005 |

(Continued)

FOREIGN PATENT DOCUMENTS

CN 102522495 A 6/2012

OTHER PUBLICATIONS

English translation of Chinese Office Action issued in Chinese Application No. 201810637641.6 dated Jan. 20, 2020 (nine pages).

*Primary Examiner* — Natalie Huls
*Assistant Examiner* — Jermaine L Jenkins
(74) *Attorney, Agent, or Firm* — Crowell & Moring LLP

(57) ABSTRACT

A pressure sensor according to an aspect of the present invention comprises a plurality of piezoelectric elements that are sheet-like and laminated, wherein: the plurality of piezoelectric elements are divided into a plurality of element groups; and the plurality of element groups are connected in parallel and in each element group the piezoelectric elements are connected in series, or the plurality of element groups are connected in series and in each element group the piezoelectric elements are connected in parallel.

5 Claims, 7 Drawing Sheets

(56) References Cited

U.S. PATENT DOCUMENTS

| | | | | |
|---|---|---|---|---|
| 9,864,450 B2* | 1/2018 | Watazu | ............... | H01L 41/0478 |
| 10,170,685 B2* | 1/2019 | Grosh | ................... | B81B 3/0021 |
| 2006/0257286 A1* | 11/2006 | Adams | ............... | G01N 29/4418 |
| | | | | 422/82.01 |
| 2009/0129611 A1 | 5/2009 | Leidl et al. | | |
| 2010/0139621 A1* | 6/2010 | Murai | ................. | H01L 41/0838 |
| | | | | 123/472 |
| 2015/0008798 A1* | 1/2015 | Kato | ........................ | H02N 2/18 |
| | | | | 310/339 |
| 2016/0146680 A1* | 5/2016 | Bao | ........................ | E21B 47/06 |
| | | | | 73/862.59 |
| 2018/0269376 A1* | 9/2018 | Bernard | ................. | G01V 1/208 |
| 2018/0296843 A1* | 10/2018 | Friis | ...................... | A61F 2/4455 |

* cited by examiner

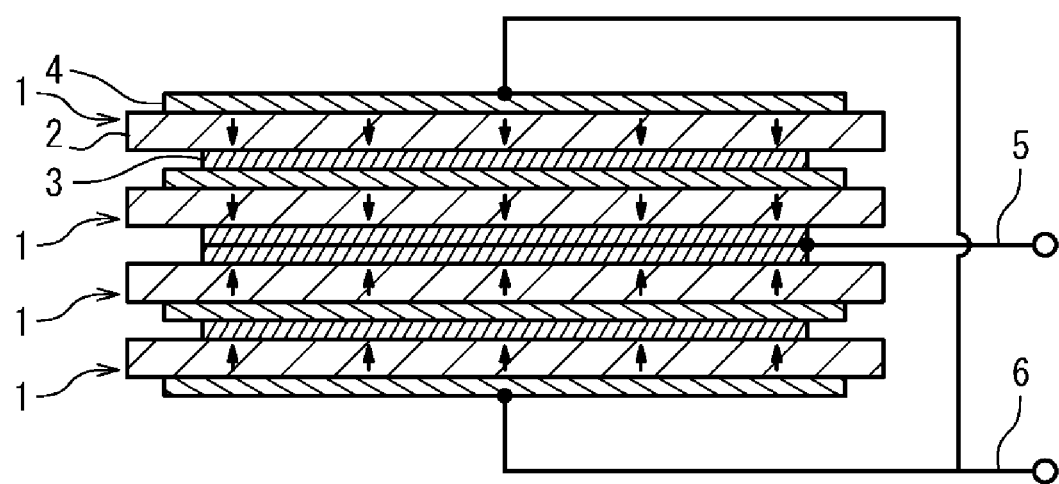
F I G. 1

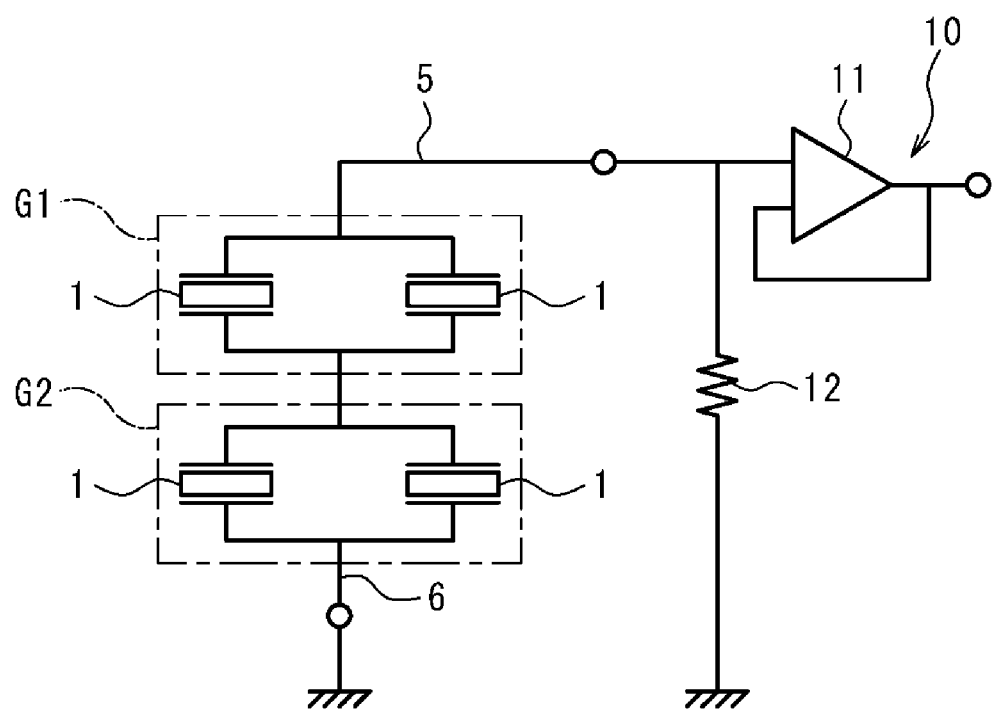
F I G . 4

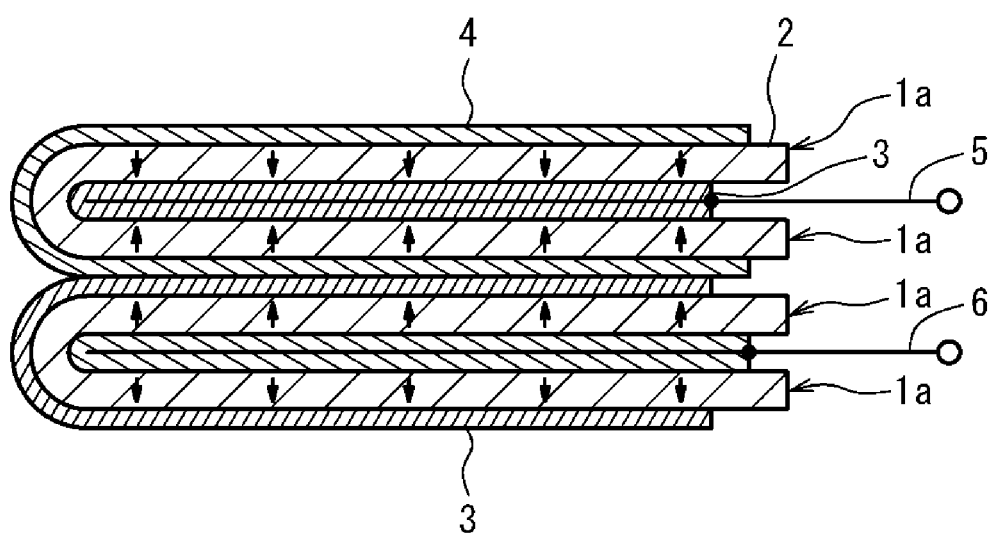
F I G. 5

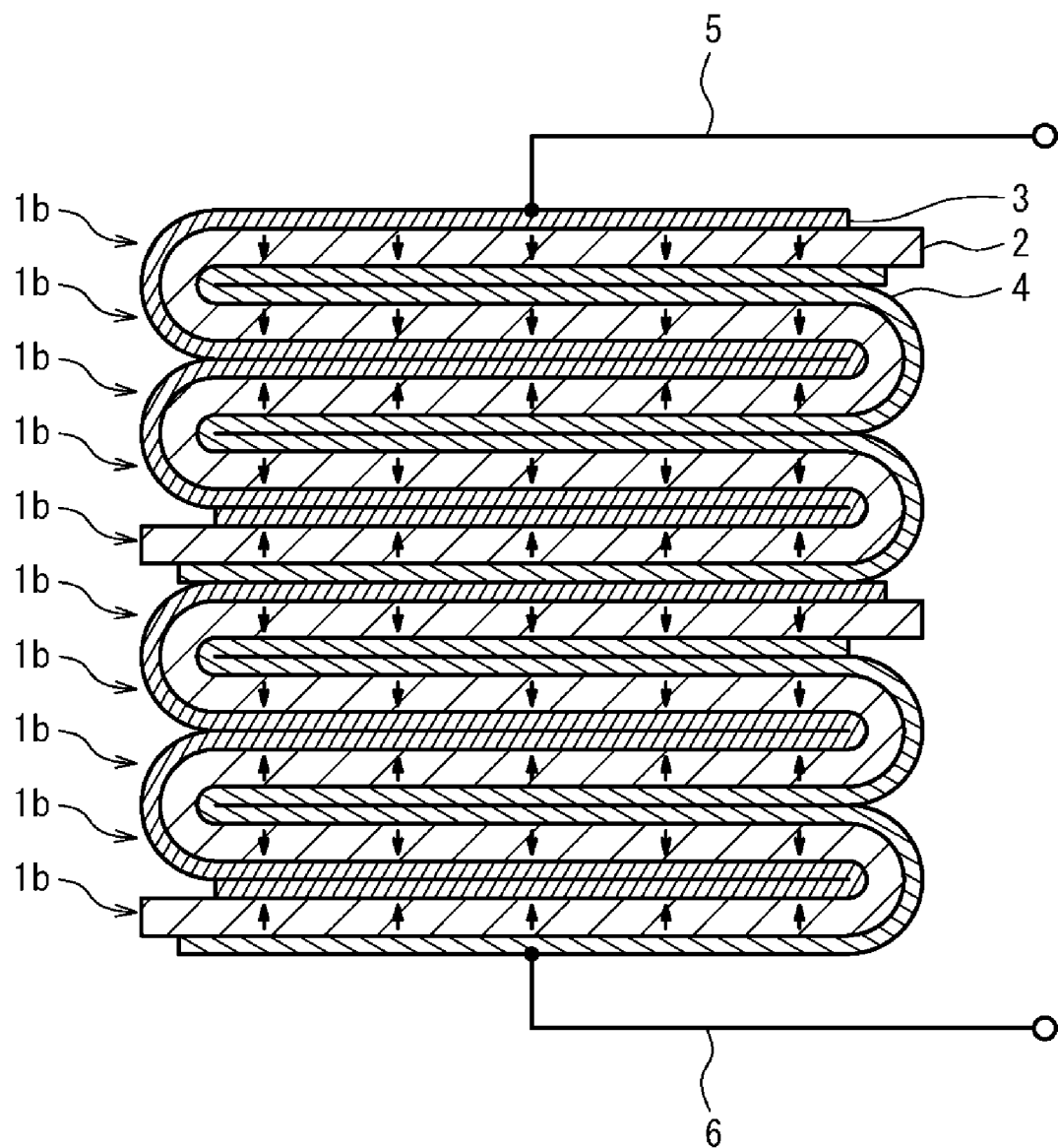
F I G. 7

PRESSURE SENSOR HAVING A PLURALITY OF SHEET-LIKE AND LAMINATED PIEZOELECTRIC ELEMENTS

BACKGROUND OF THE INVENTION

The present invention relates to a pressure sensor.

Description of the Related Art

As a sensor for detecting pressure, a piezoelectric element is used that has electrodes provided on both faces of a sheet-shaped piezoelectric body and detects potential changes between electrodes that fluctuate in accordance with thickness changes of the piezoelectric body associated with pressure changes. Noise in such a piezoelectric element is referred to as "kT/C noise", of which voltage is substantially inversely proportional to the square root of capacitance (electrostatic capacity) between the electrodes.

Consequently, increasing the capacitance between the electrodes enables reduction in noise voltage. However, for example, in a case of detection of pressure fluctuation due to acoustic wave vibration, merely increasing an area of the piezoelectric body rather results in a decrease in an S/N ratio, due to a phase of displacement being different between positions on the piezoelectric body and consequent cancellation of detected signals at these positions by one another.

In this regard, U.S. Pat. No. 7,376,239 proposes an electromechanical transducer (pressure sensor or piezoelectric actuator) in which a plurality of piezoelectric elements, each having a piezoelectric body and a pair of electrodes, are laminated and connected in parallel. In a case of using the electromechanical transducer as a pressure sensor, since the plurality of piezoelectric elements are disposed at the same position to overlap each other and have therefore substantially equal phases, the aforementioned problem of phase difference is not caused, leading to an increase in the S/N ratio.

The constitution disclosed in the aforementioned publication is expected to improve detection accuracy due to the higher capacitance, but cannot be expected to improve detection sensitivity since output voltage is the same as that in the case of using a single piezoelectric element.

PRIOR ART DOCUMENTS

Patent Documents

Patent Document 1: U.S. Pat. No. 7,376,239

SUMMARY OF THE INVENTION

Problems to be Solved by the Invention

In view of the inconvenience described above, an object of the present invention is to provide a pressure sensor having a high S/N ratio and high sensitivity.

Means for Solving the Problems

A pressure sensor according to an aspect of the present invention made for solving the aforementioned problems includes a plurality of piezoelectric elements that are sheet-like and laminated, wherein: the plurality of piezoelectric elements are divided into a plurality of element groups; and the plurality of element groups are connected in parallel and in each element group the piezoelectric elements are connected in series, or the plurality of element groups are connected in series and in each element group the piezoelectric elements are connected in parallel.

BRIEF DESCRIPTION OF THE DRAWINGS

FIG. 1 is a schematic cross sectional view illustrating a constitution of a pressure sensor according to an embodiment of the present invention;

FIG. 4 is an equivalent circuit diagram of the pressure sensor illustrated in FIG. 3;

FIG. 5 is a schematic cross sectional view illustrating a constitution of a pressure sensor according to an embodiment of the present invention different from those of FIGS. 1 and 3;

FIG. 7 is a schematic cross sectional view illustrating a constitution of a pressure sensor according to an embodiment of the present invention different from those of FIGS. 1, 3, 5 and 6.

DESCRIPTION OF EMBODIMENTS

Figure 2:
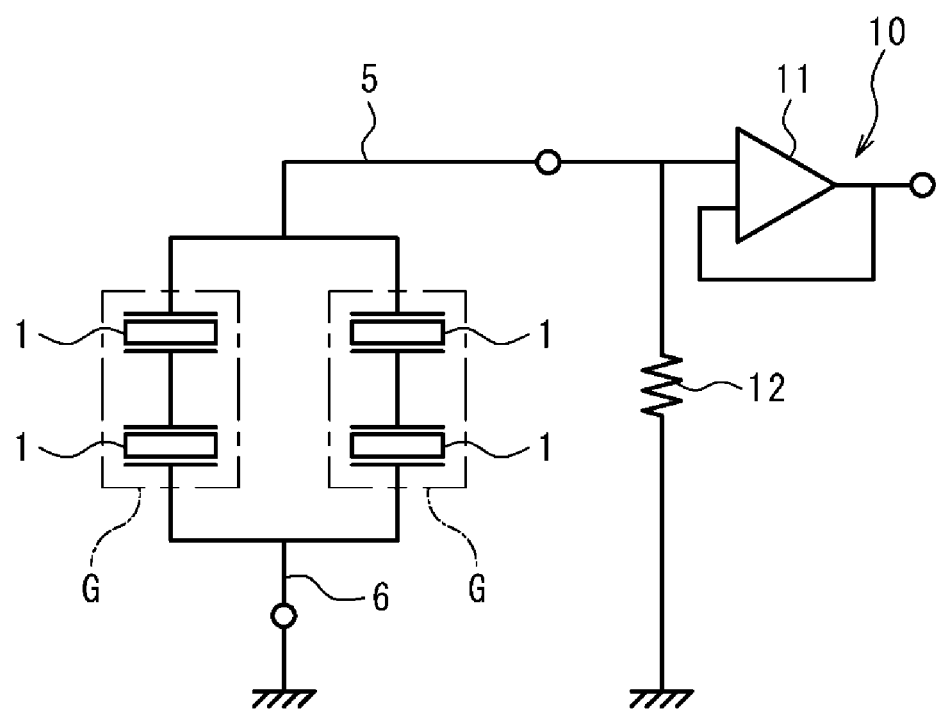
FIG. 2 is an equivalent circuit diagram of the pressure sensor illustrated in FIG. 1.

Embodiments of the present invention will be described in detail hereinafter, with appropriate reference to the drawings.

A pressure sensor according to an aspect of the present invention includes a plurality of piezoelectric elements which are sheet-like and laminated, in which: the plurality of piezoelectric elements 1 are divided into a plurality of element groups; and the plurality of element groups are connected in parallel and in each element group the piezoelectric elements are connected in series, or the plurality of element groups are connected in series and in each element group the piezoelectric elements are connected in parallel.

The pressure sensor has high output voltage, and in turn high detection sensitivity, due to the plurality of piezoelectric elements in each element group or the plurality of element groups being connected in series. In addition, the pressure sensor has a high S/N ratio due to the plurality of element groups or the plurality of piezoelectric elements in each element group being connected in parallel.

In the pressure sensor, the piezoelectric elements may be connected in series in each element group and the number of the element groups may be even. According to this constitution, since two outermost electrodes have the same polarity, an electromagnetic shield function can be imparted through grounding of the two outermost electrodes.

In the pressure sensor, an electrode on an outer side of the outermost piezoelectric element may be a negative electrode. According to this constitution, since the pressure sensor outputs positive potential to the outermost electrode, easy processing of the output voltage is enabled through grounding of the outermost electrode.

In the pressure sensor, in the each element group: the piezoelectric elements may be connected in parallel; and adjacent piezoelectric elements may be formed by folding back a piezoelectric sheet. According to this constitution, wiring is not required for connecting the piezoelectric elements in each element group and for connecting the element groups, leading to simplification of the structure of the pressure sensor.

In the pressure sensor in which, in the each element group, the piezoelectric elements are connected in parallel and adjacent piezoelectric elements are formed by folding back the piezoelectric sheet, outermost electrodes in each element group may be a positive electrode and a negative electrode. According to this constitution, laminating the plurality of element groups enables connection of the element groups in series, resulting in further simplification of the structure of the pressure sensor.

In the pressure sensor, the piezoelectric element may include a polymeric piezoelectric body which is sheet-like, and a pair of electrodes laminated on both faces of the polymeric piezoelectric body. According to this constitution, the comparatively small thickness of the pressure sensor, as well as detection of a low-energy pressure change, for example, acoustic wave vibration etc., are achieved.

As described above, the pressure sensor according to an aspect of the present invention has the high S/N ratio and high sensitivity.

First Embodiment

FIG. 1 shows a pressure sensor according to an embodiment of the present invention. The pressure sensor includes a plurality of piezoelectric elements 1 that are sheet-like and laminated.

Each piezoelectric element 1 includes a sheet-like piezoelectric body 2 in which polarization changes in a thickness direction upon application of pressure, and a pair of electrodes (a positive electrode 3 and a negative electrode 4) laminated on both faces of the piezoelectric body 2. The positive electrode 3 is laminated on a face of the piezoelectric body 2 to be positively charged upon application of pressure to the piezoelectric body 2, and the negative electrode 4 is laminated on a face of the piezoelectric body 2 to be negatively charged upon application of pressure to the piezoelectric body 2. Arrows in FIG. 1 indicate directions of polarization in the piezoelectric body 2.

In the pressure sensor, as shown in the equivalent circuit of FIG. 2, the plurality of piezoelectric elements 1 are divided into two element groups G. Two piezoelectric elements in each element group G are electrically connected in series. Meanwhile, the two element groups G are electrically connected in parallel. The pressure sensor is connected to a detection circuit (not illustrated) via, for example, an impedance converting circuit 10.

Specifically, two adjacent piezoelectric elements 1 in each element group G are connected in series by being laminated in such a way that the piezoelectric bodies 2 have the same direction of polarization. As a result, the two piezoelectric elements 1 in the element group G are laminated in such a way that the positive electrode 3 of one piezoelectric element abuts the negative electrode 4 of the other piezoelectric element.

Meanwhile, two adjacent element groups G are connected in parallel by being laminated in such a way that the piezoelectric bodies 2 have opposite directions of polarization. It is preferred that the two adjacent element groups G are laminated in such a way that the positive electrodes 3 as the outermost layers of these element groups G abut each other. To the two abutting positive electrodes 3 in these element groups G, positive electrode wiring 5 which extends to the exterior is connected. In addition, to the negative electrode 4 disposed on the outer side of each element group G, negative electrode wiring 6 which connects the negative electrodes 4 together and extends to the exterior is connected.

The pressure sensor has high output voltage due to the two piezoelectric elements 1 in each element group G being connected in series and resulting superposition of output voltage from the two piezoelectric elements 1. Consequently, the pressure sensor is superior in detection sensitivity.

In addition, the pressure sensor has high capacitance due to the two element groups G being connected in parallel. More specifically, a capacitance reduction resulting from connecting in series the piezoelectric elements 1 in each element group G is compensated by connecting in parallel the element groups G. As a result, the pressure sensor has the high S/N ratio due to a reduction in noise voltage, which is caused by thermal noise and is substantially inversely proportional to the square root of capacitance.

In the pressure sensor, the number of the element groups G is even. Consequently, in the case where the element groups G are connected in parallel, the two outermost electrodes (negative electrodes 4) have the same polarity. As a result, the pressure sensor is enabled to have a higher S/N ratio, since the electromagnetic shield function can be imparted to the two outermost electrodes through grounding of the two outermost electrodes as illustrated in FIG. 2.

Furthermore, due to the two outermost electrodes being the negative electrodes 4 in the pressure sensor, in the case where the electromagnetic shield function is imparted to the two negative electrodes 4 through grounding, the potential of the negative electrodes 4 is the reference potential, and the potential of the positive electrode 3 is the output voltage, i.e., the output voltage is positive. Easy processing of the output voltage is thus enabled.

Piezoelectric Body

A piezoelectric material for forming the piezoelectric body 2 may be an inorganic material such as lead zirconate titanate, but is preferably a polymer piezoelectric material. Due to the piezoelectric body 2 being a polymer piezoelectric body formed from the polymer piezoelectric material, the comparatively small thickness of the pressure sensor as a whole can be attained in the form of a film, sheet, or fiber, while reliable detection of the low-energy pressure change, for example, acoustic wave vibration etc., is enabled.

Examples of the polymer piezoelectric material include polyvinylidene fluoride (PVDF), vinylidene fluoride-trifluoroethylene copolymer (P(VDF/TrFE)), vinylidene cyanide-vinyl acetate copolymer (P(VDCN/VAc)), and the like.

Alternatively, a polymer material such as polytetrafluoroethylene (PTFE), polypropylene (PP), polyethylene (PE) or polyethylene terephthalate (PET) that inherently has no piezoelectric characteristics may be used as the piezoelectric body 2, the polymer material being provided with piezoelectric characteristics through: forming of a large number of flattened pores; and electrically charging and polarizing (electret-making) opposite faces of the flattened pores by, for example, corona discharge.

The lower limit of the average thickness of the piezoelectric body 2 is preferably 10 µm and more preferably 50 µm. Meanwhile, the upper limit of the average thickness of the piezoelectric body 2 is preferably 500 µm and more preferably 200 µm. When the average thickness of the piezoelectric body 2 is less than the lower limit, the strength of the piezoelectric body 2 may be insufficient. To the contrary, when the average thickness of the piezoelectric body 2 is greater than the upper limit, the deformability of the piezoelectric body 2 may be impaired, leading to insufficient detection sensitivity.

Electrode

The electrodes 3 and 4 may be formed from any conductive material, examples of which include: metals such as aluminum, silver, copper and nickel; carbon; and the like.

A process of laminating the electrodes 3 and 4 on the piezoelectric body 2 is not particularly limited, and is exemplified by vapor deposition of a metal, printing with conductive carbon ink, application and drying of a silver paste, and the like.

The average thickness of the electrodes 3 and 4, which may vary depending on a process of laminating, is, for example, 0.1 μm or more and 30 μm or less, but is note limited thereto. When the average thickness of the electrodes 3 and 4 is less than the lower limit, the strength of the electrodes 3 and 4 may be insufficient. To the contrary, when the average thickness of the electrodes 3 and 4 is greater than the upper limit, the pressure sensor may be unduly thick and transmission of the pressure change such as acoustic wave vibration to the piezoelectric body 2 may be inhibited.

The electrodes 3 and 4 may also be formed to be divided into a plurality of regions in a planar view, such that the piezoelectric element 1 effectively serves as a plurality of elements.

The pressure sensor is preferably connected to a detection circuit in such a way that the negative electrode wiring 6 is grounded and provides reference potential, and that the detection circuit can detect the potential of the positive electrode wiring 5. Due to grounding of the negative electrode wiring 6, the negative electrode 4 as the outermost layer serves as an electromagnetic shield, and consequently the reduction of the electromagnet noise applied to the pressure sensor from the environment, and in turn an increase in the S/N ratio are enabled.

In each piezoelectric element 1, it is preferred that the negative electrode 4 is greater than the positive electrode 3 in a planar view, and the positive electrode 3 is encompassed in a projection region of the negative electrode 4. Due to the negative electrode 4 thus encompassing the positive electrode 3 in a planar view, in the case where the electromagnetic shield function is imparted to the negative electrode 4 through grounding of the negative electrode wiring, more effective prevention of the electromagnetic noise from reaching the positive electrode 3 is enabled.

Impedance Converting Circuit

As the impedance converting circuit 10 used for inputting the output from the pressure sensor to the detection circuit, a well-known circuit including an operational amplifier 11 and a load resistor 12 may be used as illustrated in FIG. 2.

In the case of the pressure sensor being connected to such an impedance converting circuit 10, the thermal noise (noise voltage) is generated in the load resistor 12 due to the Brownian motion of electrons.

The noise voltage $V_n$[V] in the load resistor 12 satisfies the relationship represented by the following equation (1), in which k denotes the Boltzmann's constant, T denotes the temperature [K] of a conductor, and R denotes the resistance value [Ω] of the load resistor 12.

$$V_n^2 = 4kTR \ [V^2/Hz] \tag{1}$$

When the pressure sensor which is a capacitor supplies an electric current to the load resistor 12, the power of the noise may be represented by the following equation (2), in which C denotes the capacitance [F] of the pressure sensor and ω denotes each frequency [rad/s].

$$V_n^2 = (4kTR)/(1+C^2R^2\omega^2) \ [V^2/Hz] \tag{2}$$

Integrating the above equation in the frequency domain gives the following equation (3).

$$V_n = \sqrt{(kT/C)} \ [V] \tag{3}$$

The noise voltage $V_n$ due to the thermal noise represented by the equation (3) is referred to as "kT/C noise". Since the temperature T assumedly does not change greatly, the noise voltage $V_n$ proves to be substantially inversely proportional to the square root of capacitance C of the pressure sensor.

In addition, in the case of the pressure sensor being connected to the impedance converting circuit 10 including the load resistor 12, a characteristic of a high-pass filter is obtained that a signal level in a low-frequency band of the detection signal input from the pressure sensor to the operational amplifier 11 is lowered, due to the connection between the load resistor 12 and the pressure sensor, which can be considered to be a capacitor. Therefore, the cut-off frequency of the high-pass filter needs to be set below the frequency of the pressure change to be detected, through adjustment of the capacitance of the pressure sensor and the resistance value of the load resistor 12.

However, when the cut-off frequency of the high-pass filter being set is too low, unnecessary low-frequency signals are input to the operational amplifier 11 and may exceed the signal level (input range) processable by the impedance converting circuit 10, leading to a failure to output a proper detection signal.

In the pressure sensor, due to the capacitance reduction resulting from connecting in series the piezoelectric elements 1 in each element group G being compensated by connecting in parallel the element groups G, optimization of the cut-off frequency of the high-pass filter is enabled, and in turn, an increase in the S/N ratio in the frequency domain of the pressure change to be detected is enabled.

As set forth above, the pressure sensor is superior in the detection sensitivity due to the plurality of piezoelectric elements 1 connected in series in each element group G, and has the high S/N ratio due to the reduction in the noise voltage by the parallel connection of the plurality of element groups G.

Second Embodiment

Figure 3:
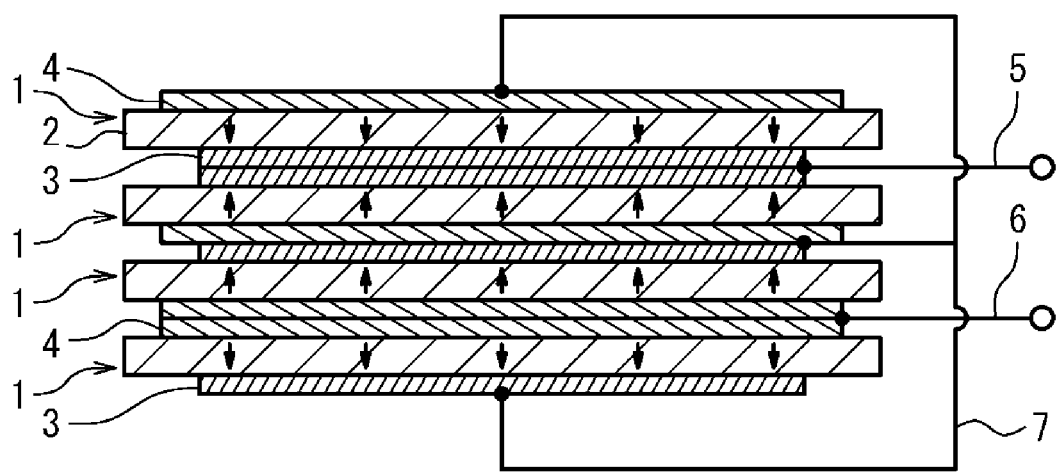
FIG. 3 is a schematic cross sectional view illustrating a constitution of a pressure sensor according to an embodiment of the present invention different from that of FIG. 1.

FIG. 3 shows a pressure sensor according to another embodiment of the present invention.

The pressure sensor includes a plurality of piezoelectric elements 1 that are sheet-like and laminated. In the pressure sensor in FIG. 3, the piezoelectric element 1 has the same constitution as the piezoelectric element 1 in the pressure sensor of FIG. 1, except for its orientation. Hereinafter, with regard to the pressure sensor of FIG. 3, constitutive elements that are identical to those of the pressure sensor of FIG. 1 are referred to with the same reference numerals and explanation thereof is omitted.

In the pressure sensor, as shown in the equivalent circuit of FIG. 4, the plurality of piezoelectric elements 1 are divided into two element groups (first element group G1 and second element group G2) and are electrically connected in parallel in each of the element groups G1 and G2, while the two element groups G1 and G2 are electrically connected in series.

Specifically, two adjacent piezoelectric elements 1 in each of the element groups G1 and G2 are connected in series by being laminated in such a way that the piezoelectric bodies 2 have the opposite directions of polarization. In the element group G1, the piezoelectric elements 1 are oriented such that the electrode as the outermost layer is the negative electrode 4, and the positive electrode wiring 5 extending to the exterior is connected to the positive electrodes 3 abutting each other on the inner side. Meanwhile, in the element group G2, the piezoelectric elements 1 are oriented such that the electrode as the outermost layer is the positive electrode 3, and the negative electrode wiring 6 extending to the exterior is connected to the negative electrodes 4 abutting each other on the inner side. The pressure sensor further includes inner wiring 7 that electrically connects between the negative electrode 4 as the outermost layer of the first element group G1 and the positive electrode 3 as the outermost layer of the second element group G2.

As set forth above, the pressure sensor has the reduced noise voltage due to two piezoelectric elements 1 being connected in parallel in each of the element groups G1 and G2, and is superior in detection sensitivity due to the element groups G1 and G2 being connected in series and resulting superposition of output voltage.

Third Embodiment

FIG. 5 shows a pressure sensor according to still another embodiment of the present invention.

The pressure sensor includes a plurality of piezoelectric elements 1a that are sheet-like and laminated. In the pressure sensor, the plurality of piezoelectric elements 1a are divided into two element groups. Each element group includes two piezoelectric elements 1a electrically connected in parallel. Meanwhile, in the pressure sensor, the two element groups are electrically connected in series.

In the pressure sensor of FIG. 5, in the each element group, adjacent piezoelectric elements 1a are formed by folding back a piezoelectric sheet. The piezoelectric sheet includes a sheet-like piezoelectric body 2 in which polarization changes in a thickness direction upon application of pressure, and a pair of electrodes (a positive electrode 3 and a negative electrode 4) laminated on both faces of the piezoelectric body 2.

The piezoelectric body 2, the positive electrode 3 and the negative electrode 4 in the pressure sensor of FIG. 5 may have the same constitutions as the piezoelectric body 2, the positive electrode 3 and the negative electrode 4 in the pressure sensor of FIG. 1 except that two piezoelectric elements 1a are formed by folding back and functionally dividing the piezoelectric sheet at a fold line.

In the pressure sensor of FIG. 5, since the adjacent piezoelectric elements 1a are formed by folding back the piezoelectric sheet, the positive electrodes 3 of the adjacent piezoelectric elements 1a are electrically connected to each other and the negative electrodes 4 of the adjacent piezoelectric elements 1a are electrically connected to each other. Thus, unlike the pressure sensor of FIG. 3, the pressure sensor of FIG. 5 does not require the inner wiring for connecting the electrodes, resulting in simple constitution, easy production, and stable quality.

Fourth Embodiment

Figure 6:
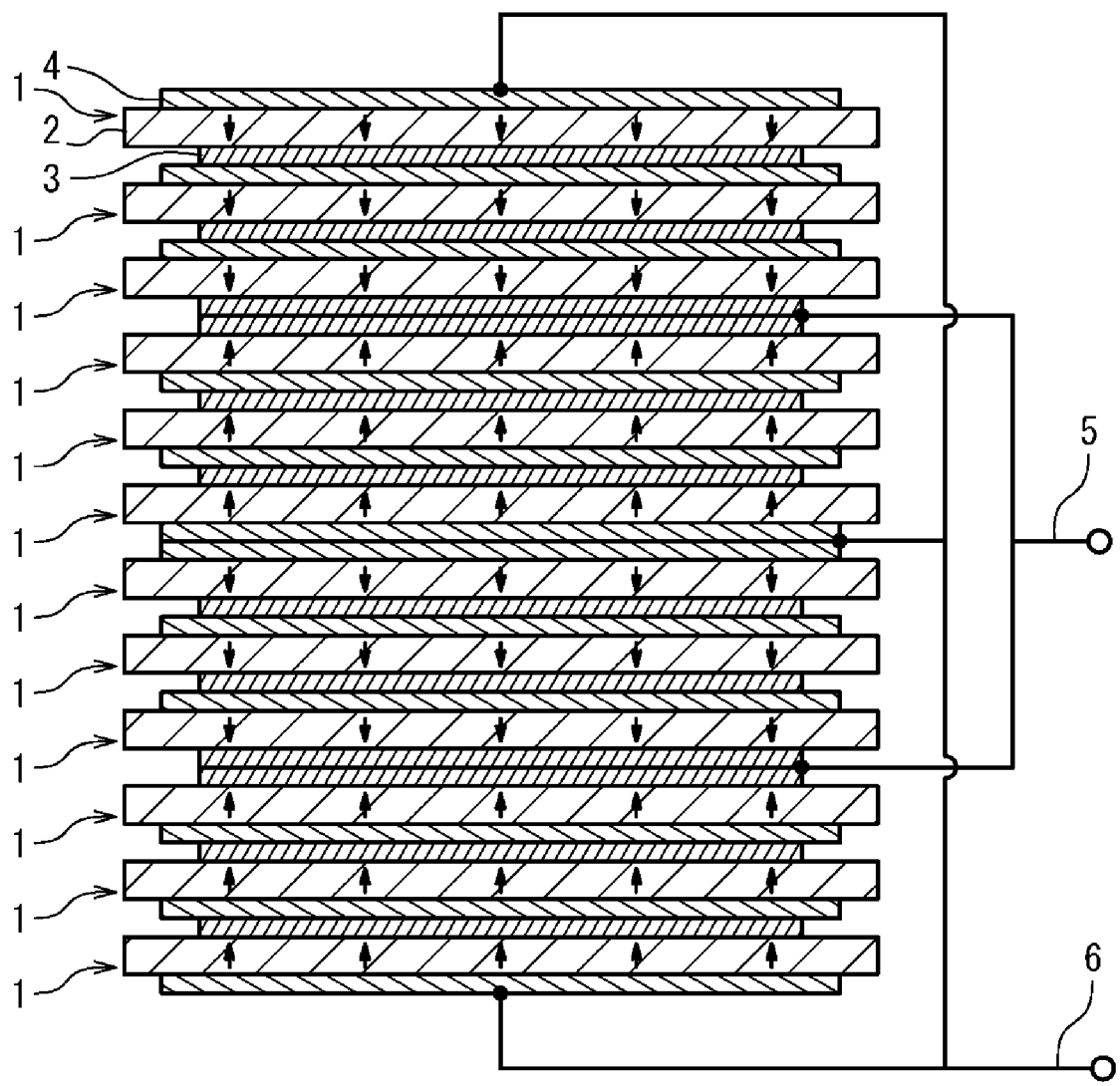
FIG. 6 is a schematic cross sectional view illustrating a constitution of a pressure sensor according to an embodiment of the present invention different from those of FIGS. 1, 3 and 5.

FIG. 6 shows a pressure sensor according to yet another embodiment of the present invention.

The pressure sensor includes a plurality of piezoelectric elements 1 that are sheet-like and laminated. In the pressure sensor in FIG. 6, the piezoelectric element 1 may have the same constitution as the piezoelectric element 1 in the pressure sensor of FIG. 1.

In the pressure sensor, the plurality of piezoelectric elements 1 are divided into four element groups each including three piezoelectric elements 1. In the pressure sensor, the three piezoelectric elements 1 are electrically connected in series in each element group, while the four element groups are electrically connected in parallel.

The three piezoelectric elements 1 in each element group are connected in series by being laminated in such a way that the piezoelectric bodies 2 have the same direction of polarization. Meanwhile, two adjacent element groups are connected in parallel by being laminated in such a way that the piezoelectric bodies 2 have opposite directions of polarization.

The pressure sensor includes: the positive electrode wiring 5 that is connected to each of the pairs of abutting positive electrodes 3, the each of the pairs being formed between the adjacent element groups, and extends to the exterior to be connected to the impedance converting circuit; and the negative electrode wiring 6 that is connected to each of the pairs of abutting negative electrodes 4, the each of the pairs being formed between the adjacent element groups and connected to the negative electrodes 4 as the outermost layers, and extends to the exterior to be grounded.

Meanwhile, two adjacent element groups G are connected in parallel by being laminated in such a way that the piezoelectric bodies 2 have opposite directions of polarization. It is preferred that the two adjacent element groups G are laminated in such a way that the positive electrodes 3 as the outermost layers abut each other. To the two positive electrodes 3 abutting each other in these element groups G, the positive electrode wiring 5 which extends to the exterior is connected. In addition, to the negative electrode 4 disposed on the outer side of each element group G, the negative electrode wiring 6 that connects the negative electrodes 4 together and extends to the exterior is connected.

The pressure sensor is superior in the detection sensitivity due to the plurality of piezoelectric elements 1 connected in series in each element group, and has the high S/N ratio due to the plurality of element groups connected in parallel.

Fifth Embodiment

FIG. 7 shows a pressure sensor according to yet still another embodiment of the present invention.

The pressure sensor includes a plurality of piezoelectric elements 1b that are sheet-like and laminated. In the pressure sensor, the plurality of piezoelectric elements 1b are divided into two element groups. Each element group includes five piezoelectric elements 1b electrically connected in parallel. Meanwhile, in the pressure sensor, the two element groups are electrically connected in series.

In the pressure sensor of FIG. 7, for each element group, a piezoelectric sheet is folded back repeatedly at a regular pitch to form the five piezoelectric elements 1b. The piezoelectric sheet in the pressure sensor of FIG. 7 may be the same as the piezoelectric sheet in the pressure sensor of FIG. 5, except for being folded back repeatedly, in other words being functionally divided into a larger number of piezoelectric elements 1b.

In the pressure sensor of FIG. 7, since each element group includes an odd number of (five) piezoelectric elements 1b, two outermost electrodes in each element group are the positive electrode 3 and the negative electrode 4. Therefore, in the pressure sensor, the two element groups can be connected in series by laminating the two element groups in such a way that the positive electrode 3 as the outermost layer in one element group abuts the negative electrode 4 as the outermost layer in the other element group. The pressure sensor of FIG. 7 does thus not require the inner wiring, resulting in simple structure and reliable electrical connection between the piezoelectric elements 1b.

Other Embodiments

The embodiments described above do not restrict the constituent features of the present invention. Therefore, any omission, substitution and addition of each of the constituent features of the embodiments can be made on the basis of the description of the present specification and common general technical knowledge, and such omitted, substituted and/or added features are to be construed to entirely fall under the scope of the present invention.

In the pressure sensor, adjacent piezoelectric elements may share one electrode. Two piezoelectric elements may be formed by, for example, alternately laminating two piezoelectric bodies and three electrodes.

In the pressure sensor, the element groups are only required to be electrically dividable, and the plurality of piezoelectric elements in each element group are not required to be adjacent to each other. A laminate of four piezoelectric elements may be formed by, for example, folding in half two piezoelectric sheets laminated in series. In this case, a pressure sensor may be formed in which: two outer piezoelectric elements are connected in parallel and constitute the first element group; two inner piezoelectric elements are connected in parallel and constitute the second element group; and the first element group and the second element group are electrically connected in series.

In the pressure sensor, the positive electrodes may be grounded. Furthermore, in the pressure sensor, both outermost layers may be positive electrodes.

The constitution of the impedance converting circuit connected to the pressure sensor is not limited to the constitutions in the above embodiments. Depending on the constitution of the detection circuit that processes the signal from the pressure sensor, the impedance converting circuit may be omitted.

Examples

Hereinafter, the present invention is described in detail by way of Examples, but the present invention should not be restrictively construed as being limited on the basis of the description of the Examples.

A constitution will be discussed hereinafter, in the case of using the pressure sensor of the present invention as an acoustic sensor, for obtaining equivalent performance to a commercially available acoustic sensor in terms of sensitivity, the S/N ratio, and the cut-off frequency.

Provided that each piezoelectric element has the piezoelectric coefficient (d33: thickness compression) of 400 pC/N and the area capacity of 22 pF/cm$^2$, monolayer sensitivity of a single piezoelectric element is about −55 dBV/Pa. Provided that the sensitivity range of the piezoelectric element is 10 mm in radius, in the case of using a single piezoelectric element, the noise (kT/C noise) due to thermal noise is about −102 dBV and the S/N ratio is about 47 dBV.

In the case where five of such piezoelectric elements are laminated and connected in series, the sensitivity is about −41 dBV/Pa and the noise due to thermal noise is −95 dBV, resulting in the S/N ratio of about 54 dBV.

In the case of Example of the pressure sensor of the present invention in which the aforementioned five-layered serially connected laminate is employed as an element group and four element groups are laminated and connected in parallel, the sensitivity is the same as that of five-layered laminate in series (single element group) and is about −41 dBV/Pa; however, the noise due to thermal noise is reduced to about −101 dBV, resulting in a higher S/N ratio which is about 60 dB.

A commercially available acoustic sensor typically has a sensitivity of about −40 dBV/Pa and an S/N ratio of about 60 dBV. Therefore, the Example of the pressure sensor of the present invention having the equivalent performance can be used as an acoustic sensor.

It is to be noted that when the load resistance of the impedance converting circuit is 50 MΩ, the cut-off frequency is about 58 Hz, which is sufficient for covering the audible range.

INDUSTRIAL APPLICABILITY

The pressure sensor according to the embodiments of the present invention may be suitably used for detecting acoustic wave vibration as the pressure change, for example, in musical devices such as a musical instrument pickup, medical devices such as a biological information measurement device, and the like.

EXPLANATION OF THE REFERENCE SYMBOLS 1, 1a, 1b Piezoelectric element
2 Piezoelectric body
3 Positive electrode
4 Negative electrode
5 Positive electrode wiring
6 Negative electrode wiring
7 Inner wiring
10 Impedance converting circuit
11 Operational amplifier
12 Load resistor

What is claimed is:
1. A pressure sensor comprising a plurality of piezoelectric elements that are sheet-like and laminated, wherein:
the plurality of piezoelectric elements are divided into a plurality of element groups;
the plurality of element groups are connected in parallel and in each element group the piezoelectric elements are connected in series, or the plurality of element groups are connected in series and in each element group the piezoelectric elements are connected in parallel; and
each piezoelectric element comprises a sheet-like polymeric piezoelectric body and a pair of electrodes laminated on both faces of the polymeric piezoelectric body.
2. The pressure sensor according to claim 1, wherein: the piezoelectric elements are connected in series in the each element group; and number of the element groups is even.
3. The pressure sensor according to claim 1, wherein an electrode on an outer side of an outermost piezoelectric element is a negative electrode.
4. The pressure sensor according to claim 1, wherein in the each element group, the piezoelectric elements are connected in parallel and adjacent piezoelectric elements are formed by folding back a piezoelectric sheet.
5. The pressure sensor according to claim 4, wherein outermost electrodes in the each element group are a positive electrode and a negative electrode.

* * * * *